US006954675B2

(12) United States Patent
Chu et al.

(10) Patent No.: US 6,954,675 B2
(45) Date of Patent: Oct. 11, 2005

(54) AUDIO CHIP WITH SWITCHABLE AUDIO OUTPUT PATHWAYS

(75) Inventors: Chia-Chin Chu, Taipei Hsien (TW); Benjamin Ym Pan, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 381 days.

(21) Appl. No.: 09/967,718

(22) Filed: Sep. 27, 2001

(65) Prior Publication Data

US 2002/0128738 A1 Sep. 12, 2002

(30) Foreign Application Priority Data

Mar. 7, 2001 (TW) ....................................... 90105274 A

(51) Int. Cl.[7] ......................... G06F 17/00; H03F 21/00; H02B 1/00

(52) U.S. Cl. ........................... 700/94; 381/120; 381/74; 381/123

(58) Field of Search .......................... 381/74, 120, 123, 381/94; 700/94

(56) References Cited

U.S. PATENT DOCUMENTS 5,719,866 A * 2/1998 Du et al. .................... 370/396
5,734,729 A * 3/1998 Tran .......................... 381/94.5
5,910,991 A * 6/1999 Farrar ......................... 381/59
6,321,278 B1 * 11/2001 Phu et al. ..................... 710/14

* cited by examiner

*Primary Examiner*—Sinh Tran
*Assistant Examiner*—Devona E Faulk
(74) *Attorney, Agent, or Firm*—J.C. Patents

(57) ABSTRACT

An audio chip with switchable audio output pathways that can be connected to an external circuit board comprises: an operational amplifier, a first output end, a second output end, a means for connection switch, and a status register. An audio signal is outputted to the external circuit board via a first output end of the audio chip. The operational amplifier receives the audio signal that, after amplification, is outputted to the external circuit board via a second output end of the audio chip. According to the connection configuration of the first and second outputs of the audio chip with respect to the external circuit board, an operator can adequately switch the means for connection switch so that a plurality of sound adjusters can control the audio signal delivered by the audio chip.

12 Claims, 2 Drawing Sheets

AUDIO CHIP WITH SWITCHABLE AUDIO OUTPUT PATHWAYS

CROSS-REFERENCE TO RELATED APPLICATION

This application claims the priority benefit of Taiwan application Ser. No. 90105274, filed Mar. 7, 2001.

BACKGROUND OF THE INVENTION

1. Field of the Invention

The present invention relates to an audio chip structure. More particularly, the present invention relates to the connection of an audio chip to a motherboard or sound card.

2. Description of the Related Art

Conventionally, a personal computer is principally composed of a motherboard provided with at least a central processing unit (CPU), a plurality of memory modules, interface cards, and peripheral members. The interface cards that compose the conventional personal computer generally are the sound card, display card, network card, and small computer system interface card (SCSI).

In the former sound cards, the audio chip has only one single audio output end. When it is connected to the sound card, the circuit layout of the audio output end is simple. In most of the current sound cards, the audio chip comprises at least a master output end and a headphone output end connected to an operational amplifier. Thus, when the audio chip is assembled within the sound card, the operator often substitutes the headphone output end for the master output end, such that the user, through the software program controlling the sound output end, cannot normally adjust the volume of the sound.

With respect to the manufacturer of audio chips, the audio chips are delivered to different manufacturers of sound cards and assembled within different types of sound cards according to different audio output layouts that are not predictable by the manufacturer of the audio chips. As a result, the program controlling the sound volume adjustment is incompatible with the actual audio output layout. A cumbersome modification of the driver program of the audio chip is then necessary to cure this deficiency.

SUMMARY OF THE INVENTION

One major aspect of the present invention is to provide an audio chip with switchable audio output pathways that can be assembled within a circuit board with a flexible audio output layout, without modifying a driver program of the audio chip To attain the above and other objectives of the invention, an audio chip with switchable audio output pathways according to a first embodiment of the present invention comprises, two ports, a OP amplifier, a master output end, a headphone output end, a status input end, and a status register. Within the above audio chip, a first audio signal is outputted out of the audio chip from a first port and through the master output end A second audio signal is delivered from a second port, amplified through the OP amplifier, and outputted out of the audio chip via the headphone output end. When the audio chip of the invention is connected to an external circuit board, the configuration of the connection of the master output end and headphone output end of the audio chip with respect to the external circuit board is stored via the status input end into the status register. The stored information about the connection layout of the audio output ends can be represented by, for example, high and low voltages applied onto the status input end. For example, a high voltage indicates that the master output end of the audio chip is connected to a master output end of the external circuit board while the headphone output end of the audio chip is connected to a headphone output end of the external circuit board. In turn, a low voltage would indicate that the master output end of the audio chip is connected to the headphone output end of the external circuit board and the headphone output end of the audio chip is connected to the master output end of the circuit board. A driver program controlling the sound volume can therefore read in the status register the actual connection configuration of the audio output ends and adequately addresses a plurality of sound volume adjusters of a software interface to the right ports.

To attain the foregoing and other aspects of the present invention, an audio chip with switchable audio output end pathways according to a second embodiment of the present invention comprises, two ports, an OP amplifier, a master output end, a headphone output end, a status input end, and a means for connection switch. Within the above audio chip, a first audio signal is outputted out of the audio chip through the means for connection switch and the master output end. A second audio signal is outputted out of the audio chip via the means for connection switch, and the OP amplifier, to the headphone output end. The means for connection switch can be, for example, a router that comprises a first and second input end, a first and second output end, and a control input end. The first and second input ends of the router respectively receive the first and second audio signals, and the first and second output ends are respectively connected to the master output end and the input end of the OP amplifier. Meanwhile, the control input end of the router is connected to the status input end. The router operates by having its first input end connected to its first output end and its second input end connected to its second output end when a high voltage is applied onto the status input end. When a low voltage is applied onto the status input end, the first input end and the second output end of the router are connected to each other while the second input end and the first output end of the router are connected to each other.

The foregoing audio chip with switchable audio output pathways may further comprise a status register connected to the status input end. The status register stores the configuration of connection of the master and headphone output ends of the audio chip with respect to the external circuit board.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings is only illustrative and not limiting.

Figure 1:
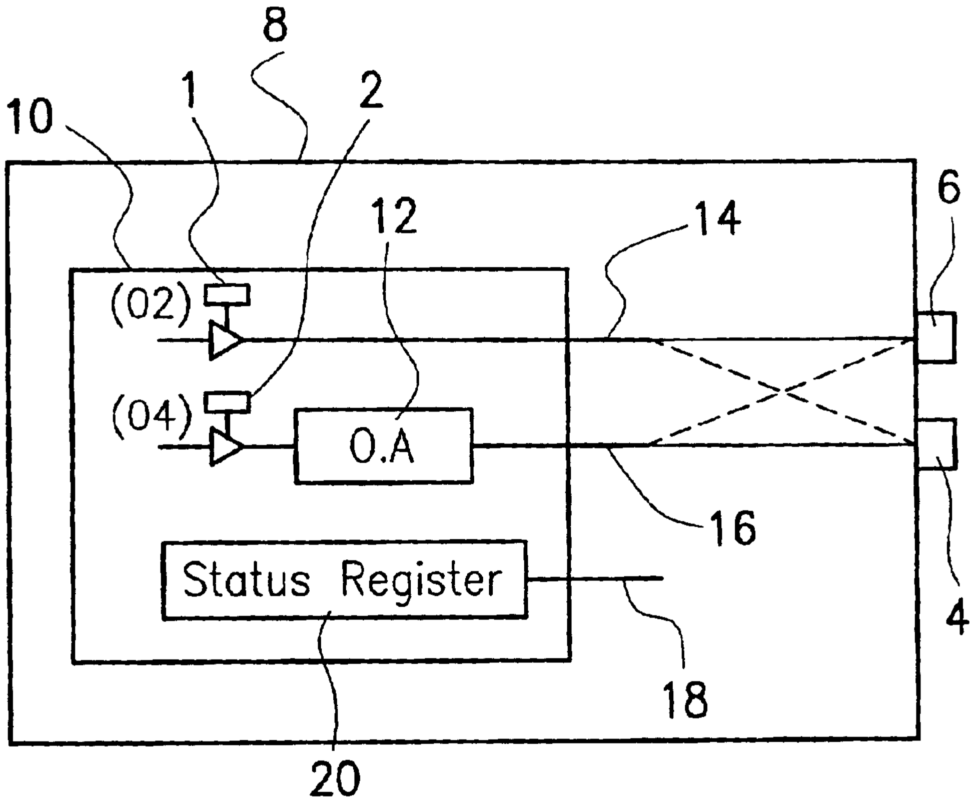
FIG. 1 is a block diagram schematically illustrating an audio chip with switchable audio output pathways according to an embodiment of the present invention.

Referring now to FIG. 1, a block diagram schematically illustrates an audio chip with switchable audio output pathways, according to a first embodiment of the present invention. The audio chip 10 comprises: a means for amplifying signal 12, a master output end 14, a headphone output end 16, a status input end 18 and a status register 20. Hereafter, an operational (OP) amplifier is used as the means for amplifying signal 12, for example. The operational amplifier 12 amplifies an audio signal that, amplified, is output through the headphone output end 16, while the master output end 14 directly outputs the audio signal not amplified. The audio chip 10 is further connected to an external circuit board 8 via respectively master and headphone output ends 6 and 4. The status register 20 receives and stores an information about the configuration of connection of the master and headphone output ends 14 and 16 with respect to the master and headphone output ends 6 and 4 of the external circuit board 8. The external circuit board 8 can be, for example, a sound card or motherboard.

Practically, the audio chip 10 controls, for example via respectively two ports (02) and (04), the outputs of the sound signal delivered to the external circuit board 8 via the master output end 14 and headphone output end 16. The master and headphone output ends of the audio chip 10 are coupled with the master and headphone output ends of the circuit board 8 through a plurality of pins of the audio chip 10 (not shown). The status register 20 indicates whether the master output ends 14, 6 and the headphone output ends 16, 4 are correspondingly connected or crossly connected. A cross-connection means that a master output end of the audio chip is connected to a headphone output end of the circuit board 8 while a corresponding connection means that master output ends are connected to each other and headphone output ends are connected to each other. In the present invention, the above configurations of the outputs of the audio chip 10 with respect to the outputs of the circuit board 8 can be represented by, for example, high and low voltages. For example, a high voltage may represent a corresponding connection between both master output ends and between both headphone output ends while a low voltage would indicate a cross-connection between the master/headphone output end of the audio chip 10 and the headphone/master output end of circuit board 8. As a result, a driver program of the audio chip 10 (not shown), reading the configuration of the master and headphone output ends in the status register 20, can set up an adjuster of the master output end and an adjuster of the headphone output end (not shown). The adjuster of the master output end and the adjuster of the headphone output end, typically set within a software interface for controlling the sound volume, can be thereby coupled with the right port (02) or (04) in accordance with the configuration recorded in the status register 20. The configuration of connection between the output ends of the audio chip 10 vis-à-vis the output ends of the circuit board 8 is recorded within the status register 20 by the manufacturer of the circuit board 8 after the audio chip 10 is assembled onto the circuit board 8. For example, if the status register 20 indicates a corresponding connection between the master output ends and the headphone output ends of the audio chip 10 and circuit board 8, the driver program will set the adjuster of the master output end to the port (02) while the adjuster of the headphone output end will be set to the port (04).

Figure 2:
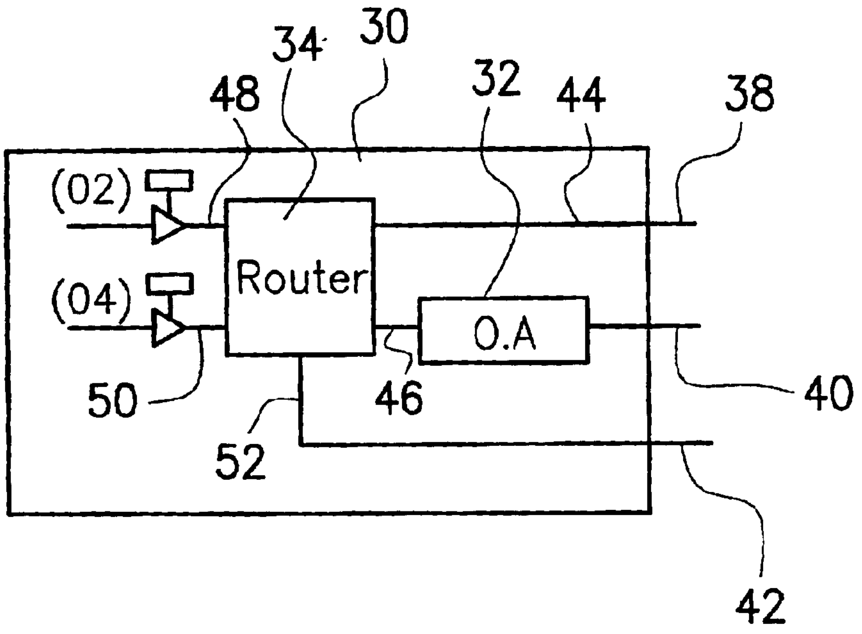
FIG. 2 is a block diagram schematically illustrating an audio chip with switchable audio output pathways according to another embodiment of the present invention.

Referring to FIG. 2, a block diagram schematically shows an audio chip with switchable audio output pathways, according to a second embodiment of the present invention. The audio chip 30, for example, comprises: an OP amplifier 32, a status input end 42, a means for connection switch 34, a master output end 38, a headphone output end 40, and two ports (02), (04). The means for connection switch can be, for example, a router 34. The operational amplifier 32 receives an audio signal that is amplified and output via a headphone output end 40, while another audio signal not amplified is output via a master output end 38. The status input end 42 receives a signal representing the connection configurations of the master and headphone output ends 38, 40 of the audio chip 30 with respect to the circuit board. Receiving a signal from the status input end 42, the router 34 consequently establishes the adequate connections, such as described hereafter.

The router 34 comprises a first input end 48, a second input end 50, a first output end 44, a second output end 46, and a control input end 52. The first and second inputs 48 and 50 are respectively connected to the ports (02) and (04) The first output end 44 of the router 34 is connected to the master output end 38, while the second output end 46 is connected to the operational amplifier 32. A signal applied to the control input end 52 connected to the status input end 42 commands the router 34 in accordance with the desired configuration of connection of the outputs of the audio chip.

For example, the router 34 may be designed so that if the control input end 52 receives a high voltage from the status input end 42, the first output end 44 is connected to the first input end 48 and the second output end 46 is connected to the second input end 50. In contrast, if a low voltage is received, the second output end 46 is connected to the first input end 48 and the first output end 44 is connected to the second input end 50 Consequently, if the port (02) is connected to, for example, the master output end 38 while the port (04) is connected to the headphone output end 40, a high voltage is applied onto the status input end 42 to establish the adequate connections. On the other hand, if the port (02) is connected to the headphone output end 40 while the port (04) is connected to the master output end 38, a low voltage is applied onto the status input end 42. Thus, when the audio chip is connected to the circuit board, an operator can switch the router 34 by applying an adequate command signal to the control input end 52, thus establishing an adequate connection of the ports (02) and (04) in accordance with the external layout. Such an operation is principally different from the previous embodiment because it is software transparent.

Figure 3:
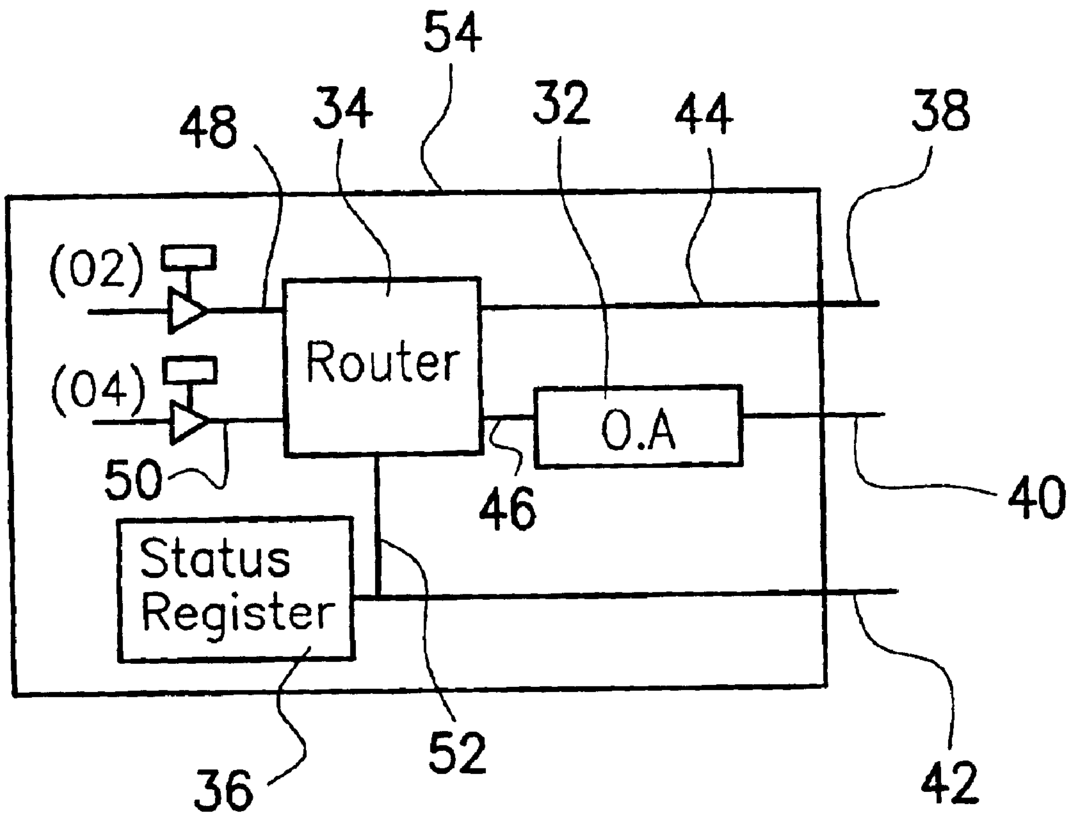
FIG. 3 is a block diagram schematically illustrating an audio chip with switchable audio output pathways according to still another embodiment of the present invention

Referring to FIG. 3, a block diagram schematically shows an audio chip with switchable audio output pathways, according to a third embodiment of the present invention. In the present embodiment, the audio chip 54, for example, comprises: an operational amplifier 32, a status input end 42, a router 34, a master output end 38, a headphone output end 40, and a status register 36. The operational amplifier 32, status input end 42, router 34, master output end 38 and headphone output end 40 are arranged such as illustrated in FIG. 2 and the above embodiment. The status register 36 is connected to the status input end 42, and receives and stores the configuration of connection of the master output end 38 and headphone output end 40 of the audio chip with respect to an external circuit board (not shown) If the manufacturer of the motherboards or sound cards wishes to change the pathways of the outputs of the audio chip 30, a specific signal is applied to the status input end 42 to switch the router 34 into the desired configuration in accordance with the output layout. The specific signal can be defined, for example, such as described above with reference to the command signal of the router of FIG. 2. This specific signal also affects the status register 36 that consequently stores the configuration of connection of the output ends set with respect to the ports (02) and (04). The configuration of connection of the output ends of the audio chip with respect to the external circuit can be thereby ulteriorly known by a software programmer who can possibly change the connection configuration using the router 34.

Accordingly, with the audio chip provided by the present invention, the manufacturer of sound cards or motherboards can advantageously apply a desired output layout without causing any incompatibility problems with respect to the driver program of the audio chips. Furthermore, the driver program of the audio chip advantageously does not need to be modified by the manufacturers of motherboards or sound cards to adapt to each specific layout used, which therefore advantageously increases the convenience and efficiency of the manufacture of motherboards and sound cards.

It will be apparent to those skilled in the art that various modifications and variations can be made to the structure and elements of the present invention without departing from the scope or spirit of the invention.

What is claimed is:

1. An audio chip with switchable audio output pathways, comprising:

an operational amplifier, wherein the operational amplifier receives an audio signal and amplifies said audio signal;

a master output end, wherein the master output end outputs said audio signal;

a headphone output end coupled to said operational amplifier, wherein the headphone output end outputs an amplified audio signal from said operational amplifier;

a status input end, wherein the status input end inputs a connection configuration of said audio chip; and a status register coupled to said status input end, wherein the status register receives and stores said connection configuration, wherein a potential level is used to set said connection configuration, so as to determine one of connections, wherein the connections include a first connection that said master output and said headphone output end respectively are coupled to a first mainboard output end and a second mainboard output end, and a second connection that said master output and said headphone output end respectively are coupled to the second mainboard output end and the first mainboard output end.

2. The audio chip of claim 1, wherein a setting of said connection configuration of said audio chip is achieved via applying high potential level and low potential level.

3. The audio chip of claim 2, wherein at high potential level, said connection configuration of said audio chip includes said master output end coupled to one of a mainboard master output end, and said headphone output end coupled to one of a mainboard headphone output end, wherein at low potential level, said connection configuration includes said master output end coupled to said mainboard headphone output end, and said headphone output end coupled to said mainboard master output end.

4. The audio chip of claim 1, wherein said audio chip is driven by a driver, determining whether a principal output end of said audio chip is either said master output end or said headphone output end depending on the content of said status register.

5. The audio chip of claim 1, further used in a notebook computer.

6. An audio chip with switchable audio output pathways, comprising:

a switch, comprising:

a first input end that receives a first audio signal;

a second input end that receives a second audio signal;

a first output end;

a second output end; and a control input end for controlling said switch and establishing a connection between said first input end and said second input end with respect to said first output end and said second output end according to a signal applied to said control input end, wherein said first output end outputs said first audio signal when a connection of said first input end and the first output end is established and said second output end outputs said second audio signal when a connection between said second input end and said second output end is established, and said first output end outputs said second audio signal when a connection of said second input end and the first output end is established and said second output end outputs said first audio signal when a connection between said first input end and said second output end is established;

an operational amplifier, having an input end connected to said second output end for outputting amplified audio signal outputted by said second output end;

a master output end coupled to said first output end of said switch, used for external connection;

a headphone output end coupled to an output end of said operational amplifier, used for external connection; and a status input end coupled to said control input end of said switch for inputting a connection configuration of said audio chip, thereby allowing said audio chip to control said switch depending on said connection configuration.

7. The audio chip of claim 6, wherein a setting of a said connection configuration of said audio chip is achieved via applying high potential level and low potential level.

8. The audio chip of claim 7, wherein at high potential level, said connection configuration of said audio chip includes said master output end coupled to one of a mainboard master output end, and said headphone output end coupled to one of a mainboard headphone output end, wherein at low potential level, said connection configuration includes said master output end coupled to said mainboard headphone output end, and said headphone output end coupled to said mainboard master output end.

9. The audio chip of claim 6, wherein said switch is commanded via a high potential level or a low potential level set on said control input end, wherein with said control input end set at high potential level, said first output end and said first input end connect to each other and said second output end and said second input end connect to each other, and wherein with said control input end set at low potential level, said second output end and said first input end connect to each other and said first output end and said second input end connect to each other.

10. The audio chip of claim 6, further comprising a status register coupled to said status input end for storing and receiving said connection configuration of said status input end.

11. The audio chip of claim 6, further used in a notebook computer.

12. A method for switching audio output pathways of an audio chip comprising a first input end, a second input end, a first output end and a second output end, said audio chip connected to an external circuit board, wherein said first input end receives a first audio signal and said second input end receives a second audio signal, said method comprising:

outputting said first audio signal and said second audio signal from said audio chip connected to said external circuit board;

establishing a connection between said first input end and said second input end with respect to said first output end and said second output end via a control input end according to a signal applied to said control input end, wherein said first audio signal is outputted via said first output end of said audio chip when a connection of said first input end and the first output end is established and said second audio signal is outputted via said second output end when a connection between said second input end and said second output end is established, and said second audio signal is outputted via said first output end when a connection of said second input end and the first output end is established and said first audio signal is outputted via said second output end when a connection between said first input end and said second output end is established;

recording the connection configuration of said first and second output ends of said audio chip with respect to said external circuit board; and adapting a driver program of said audio chip so that said driver program, according to said recorded connection configuration of said audio chip, sets a first adjuster of said first output end and a second adjuster of said second output end to control respectively said first and second audio signals, wherein said first and second adjusters are set within a sound interface.

* * * * *